United States Patent
Oki et al.

(10) Patent No.: US 7,687,973 B2
(45) Date of Patent: Mar. 30, 2010

(54) FRICTION DRIVE ACTUATOR AND HARD DISK DEVICE USING SUCH ACTUATOR

(75) Inventors: Akihiro Oki, Izumi (JP); Shigeaki Tochimoto, Ibaraki (JP); Takashi Matsuo, Suita (JP)

(73) Assignee: Konica Minolta Opto, Inc., Hachioji-shi (JP)

( * ) Notice: Subject to any disclaimer, the term of this patent is extended or adjusted under 35 U.S.C. 154(b) by 121 days.

(21) Appl. No.: 12/132,271

(22) Filed: Jun. 3, 2008

(65) Prior Publication Data
US 2008/0297002 A1  Dec. 4, 2008

(30) Foreign Application Priority Data
Jun. 4, 2007  (JP) ............................. 2007-147999

(51) Int. Cl.
*H02N 2/00* (2006.01)
(52) U.S. Cl. ............................. 310/323.02; 310/323.09; 310/323.16
(58) Field of Classification Search ............. 310/323.01, 310/323.02, 323.04, 323.06, 323.08, 323.09, 310/323.16, 323.17
See application file for complete search history.

(56) References Cited

U.S. PATENT DOCUMENTS

| | | | | |
|---|---|---|---|---|
| 4,453,103 A | * | 6/1984 | Vishnevsky et al. .... | 310/323.02 |
| 4,814,660 A | * | 3/1989 | Yamada et al. ............... | 310/328 |
| 6,147,436 A | * | 11/2000 | Claeyssen et al. ...... | 310/323.02 |
| 6,617,759 B1 | * | 9/2003 | Zumeris et al. ......... | 310/323.17 |
| 6,979,936 B1 | * | 12/2005 | Ganor et al. ................. | 310/328 |
| 7,075,212 B2 | * | 7/2006 | Witteveen .................. | 310/323.02 |
| 7,105,987 B2 | * | 9/2006 | Witteveen .................... | 310/328 |
| 7,116,037 B2 | * | 10/2006 | Moteki et al. .......... | 310/323.02 |
| 7,199,507 B2 | * | 4/2007 | Ganor et al. ................. | 310/333 |
| 7,378,777 B2 | * | 5/2008 | Moteki et al. .......... | 310/323.16 |
| 7,514,843 B2 | * | 4/2009 | Nagahama et al. .......... | 310/317 |
| 2005/0012433 A1 | * | 1/2005 | Brady et al. ........... | 310/323.08 |

FOREIGN PATENT DOCUMENTS

| | | | |
|---|---|---|---|
| JP | 4-101680 | * | 4/1992 |
| JP | 5-268779 A | | 10/1993 |
| JP | 6-78570 A | | 3/1994 |
| JP | 2000-224876 A | | 8/2000 |
| WO | WO 92/10874 | * | 6/1992 |

\* cited by examiner

*Primary Examiner*—Thomas M Dougherty
(74) *Attorney, Agent, or Firm*—Sidley Austin LLP

(57) ABSTRACT

In a friction drive actuator 1 according to the invention, a rotor 2 and a stator 4 are held in contact at a plurality of positions by a plurality of vibrators 3, and at least one of the vibrators 3 vibrates to rotate the rotor 2 relative to the stator 4. Accordingly, the rotor 2 is supported without using a bearing and, hence, the rotor 2 can be more easily elastically deformed as compared with the case where the rotor 2 and the stator 4 are held in contact over the entire circumference. Therefore, a frictional force between the stator 4 and the rotor can be stabilized.

8 Claims, 8 Drawing Sheets

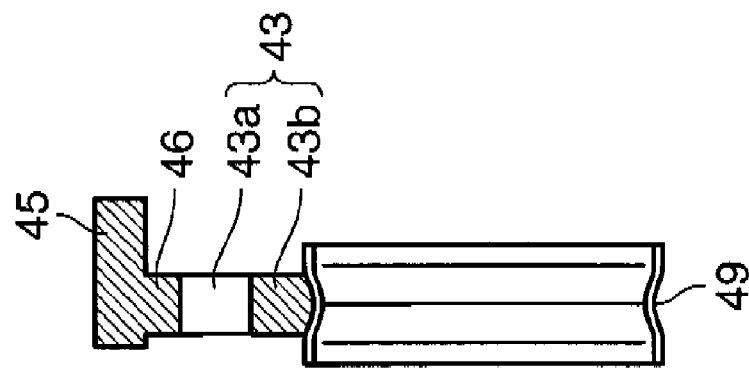
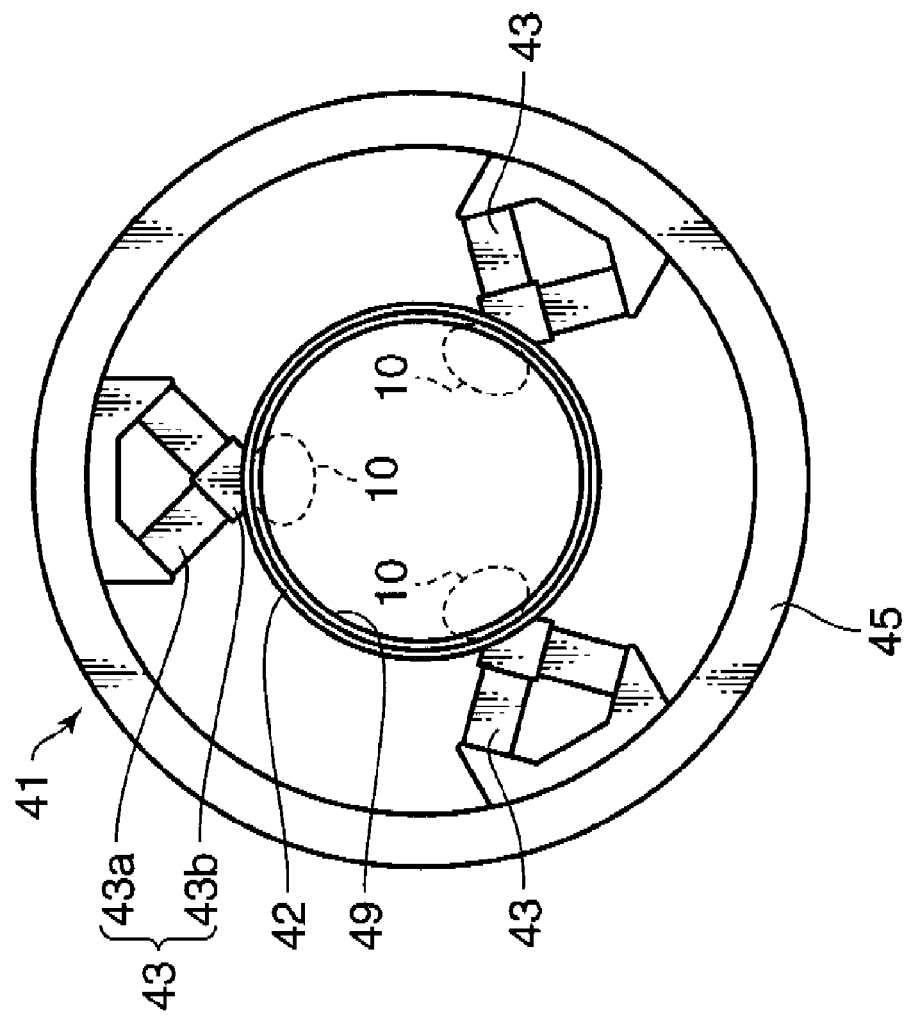

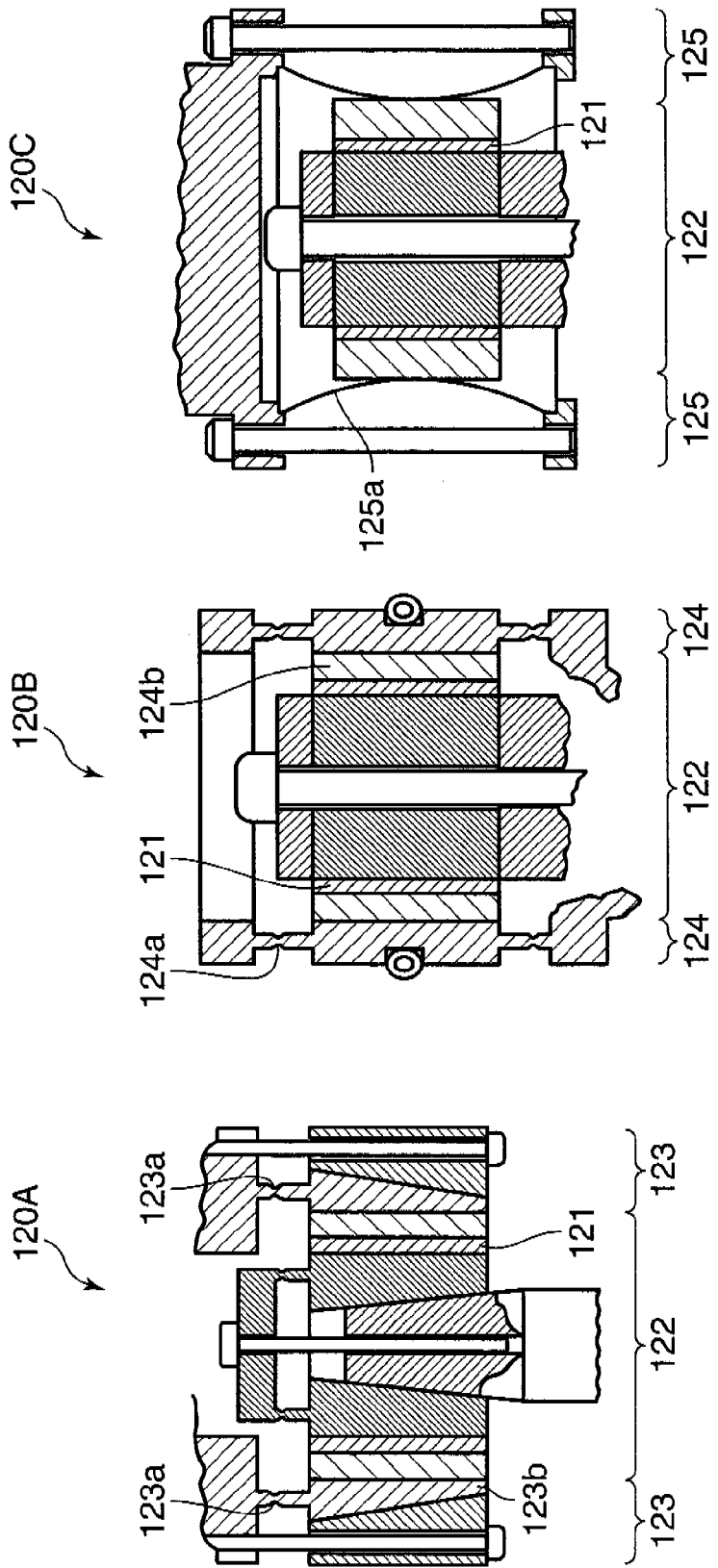

FRICTION DRIVE ACTUATOR AND HARD DISK DEVICE USING SUCH ACTUATOR

This application is based on Japanese Patent Application No. 2007-147999 filed on Jun. 4, 2007, the contents of which are hereby incorporated by reference.

BACKGROUND OF THE INVENTION

1. Field of the Invention

The present invention relates to a friction drive actuator suitably used for driving a magnetic recording head of a hard disk drive (hereinafter, also "HDD") and so-called an ultrasonic actuator, and the hard disk device.

2. Description of the Background Art

An ultrasonic actuator for driving a magnetic recording head of a HDD is required to have a highly accurate positioning performance and a high-speed response.

A typical prior art applicable for such a purpose is disclosed, for example, in Japanese Unexamined Patent Publication No. H06-78570 (hereinafter, "D1"). FIG. 7 is a section of an ultrasonic actuator according to such a prior art. This ultrasonic actuator 100 is a typical example of a general traveling-wave rotary actuator. In this ultrasonic actuator 100, ultrasonic vibration traveling in the circumferential direction of a disk is generated by a piezoelectric element 102 bonded to a disk-shaped vibrator 101 and transmitted to a movable body 104 (rotor) via a liner 103, thereby rotating the movable body 104.

However, in the ultrasonic actuator 100 of this prior art, the movable body 104 is positioned by a bearing 105 comprised of a ball bearing. The ball bearing has backlash between a ball and inner and outer rings although only to a very small extent. This causes displacements of the rotor (movable body 104) and unnecessary resonance. As a result, there is a limit to high accuracy. For example, in the case of the above HDD, there is a limit to the improvement of recording density. In addition to this backlash, the inertial mass of the ball bearing and the bearing load caused by the frictional resistance of the bearing and the viscous resistance of bearing lubricant restrict a response improvement. More specifically, a drive response in an ultrasonic actuator for driving a magnetic recording head of a HDD is normally determined by the resonant frequency of an arm portion, that of a bearing portion, that of a suspension mounted at the leading end, etc. With the miniaturization of the HDD, the resonant frequencies of the arm portion and the suspension can be designed to be relatively high, wherefore the above backlash in the bearing portion, the inertial mass and the bearing load restrict the above response.

For example, a device disclosed in Japanese Unexamined Patent Publication No. 2000-224876 (hereinafter, "D2") can be cited as another prior art capable of solving such a problem. FIG. 8 is a plan view of an information storage device using a small drive device of this prior art. In this information storage device 110, a cylindrical member 112 is fixed to the base end of a head arm 111 and three or more piezoelectric vibrators 113 are arranged around the member 112. These piezoelectric vibrators 113 undergo elliptical vibration by performing combinations of bending motions and elongating and contracting motions. The member 112 rotates by this elliptical vibration, and the head arm 111 pivots with the member 112 as a rotary shaft. Since the head arm 111 is positioned only by the piezoelectric vibrators 113 in this way without using a bearing such as the above ball bearing, there is no backlash by the bearing and the inertia and load of the bearing are reduced.

However, in the information storage device 110 of this prior art, the head arm 111 is held to be movable in a pressing direction by a spring 114 so that the piezoelectric vibrators 113 for pressing the head arm 111 generate suitable pressing (frictional) forces. Thus, the piezoelectric vibrators 113 are also pivotal in rotating directions of the head arm 111. Accordingly, a drive side also moves and such a movement of the drive side overshoots or undershoots. Therefore, a target position cannot be easily reached, which is a problem in improving the response.

For example, a device disclosed in Japanese Unexamined Patent Publication No. H05-268779 (hereinafter, "D3") can be cited as still another prior art capable of solving such a problem. FIGS. 9A to 9C are sections of ultrasonic motors according to this prior art. In the ultrasonic motors 120A, 120B and 120C, a stator 122 is formed by providing electrodes on the inner and outer circumferential surfaces of a cylindrical piezoelectric element 121, unevenness formed in the stator 122 in radial directions travels in a circumferential direction to produce a traveling wave, and a rotor 123, 124 or 125 is fitted on the outer circumferential surface of the stator.

In the ultrasonic motors 120A, 120B and 120C of this prior art, a low-rigidity part 123a, 124a or 125a as a part of the rotor 123, 124 or 125 is elastically deformed by an external force to be pressed into contact with the stator 122. Thus, there is no bearing backlash and, hence, no deviation of the center of rotation, and the response is improved.

Generally, in a bearingless friction drive actuator, in which a vibrator directly supports a rotor while being held in contact therewith in a radial direction, effective as a highly responsive rotational driving mechanism, it is important to stabilize a pressing (frictional) force for stabilizing a drive performance. In this respect, in D3, the low-rigidity pars 123a, 124a and 125a of the rotors 123, 124 and 125 are elastically deformed by external forces to generate pressing (frictional) forces to be applied to the stator 122. However, particularly in the constructions shown in FIGS. 9A and 9B, the deformations of cylindrical parts 123b, 124b are actually necessary and the deformations of the constricted low-rigidity parts 123a, 124a hardly contribute to the above pressing forces. In addition, the cylindrical parts 123b, 124b need to be deformed without being flattened while being kept in cylindrical shapes (to have arcuate cross sections in an axial direction like the low-rigidity part 125a of FIG. 9C without being squeezed). However, the low-rigidity parts 123a, 124a are actually not deformed well in such a manner. Therefore, there is a problem of being unable to stabilize the pressing (frictional) forces.

In the construction of FIG. 9C as well, the low-rigidity part 125a has a low rigidity since being a thin plane. However, since the low-rigidity part needs to be deformed without being flattened as described above, the actual solid shape is not low in rigidity. In other words, if a part is cut out in a circumferential direction, the low-rigidity part is easily deformable in the above arcuate shape. However, if the low-rigidity part has a constant thickness over the entire circumference, the rigidity thereof is far from low. The bearing backlash can be eliminated if such a large external force as to exceed the rigidity and elastically deform the low-rigidity part is applied. However, the pressing (frictional) force becomes unstable in a method accompanied by the deformation of such a high-rigidity part, thereby presenting a problem of making the drive performance unstable. Further, if the external force is large, there is also a problem that a mechanism for applying it tends to be enlarged.

SUMMARY OF THE INVENTION

In view of the above situation, an object of the present invention is to provide a friction drive actuator, in which a rotor is supported by a stator without using a bearing, capable of stabilizing a frictional force between the stator and the rotor, and a hard disk device using such an actuator.

In a friction drive actuator and a hard disk device according to the present invention, a rotor and a stator are held in contact at a plurality of positions by a plurality of vibrators, and at least one of the vibrators vibrate to rotate the rotor relative to the stator. Accordingly, the rotor is supported without using a bearing and can be easily elastically deformed as compared with the case where the rotor and the stator are held in contact over the entire circumference. Therefore, a frictional force between the stator and the rotor can be stabilized.

These and other objects, features, aspects and advantages of the present invention will become more apparent upon a reading of the following detailed description and accompanying drawings.

BRIEF DESCRIPTION OF THE DRAWINGS

FIGS. 9A through 9C are sections of an ultrasonic motor according to still another prior art.

DESCRIPTION OF THE PREFERRED EMBODIMENTS

First Embodiment

Figure 1B:
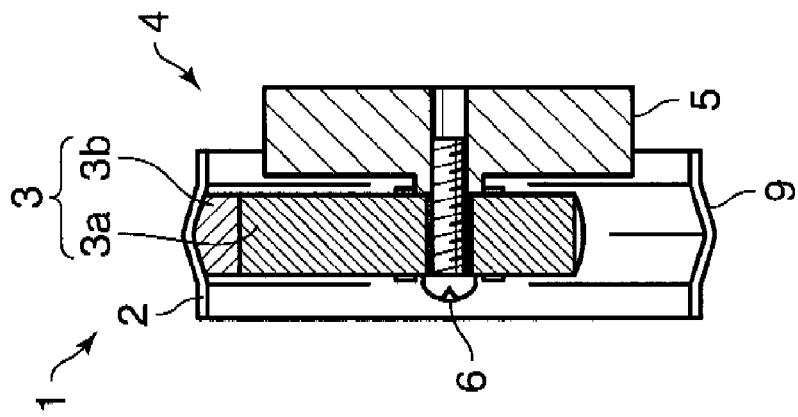
FIGS. 1A and 1B are a front view and a section showing the construction of an ultrasonic motor as a friction drive actuator according to one embodiment of the invention.
Figure 1A:
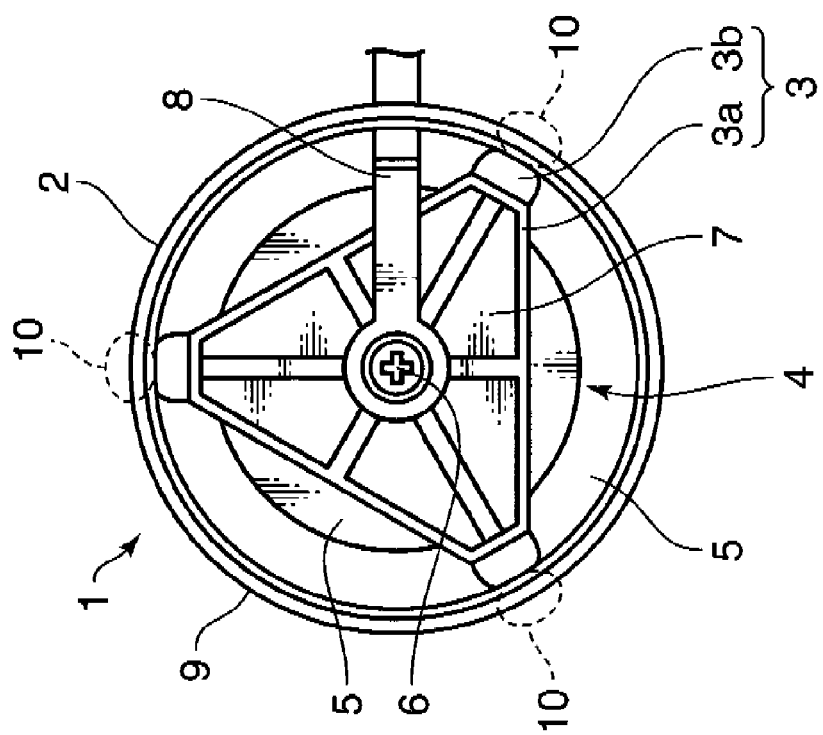

FIGS. 1A and 1B are a front view and a section showing the construction of an ultrasonic motor 1 as a friction drive actuator according to one embodiment of the present invention.

The ultrasonic motor 1 as an example of the friction drive actuator is roughly comprised of a substantially cylindrical rotor 2, and a stator 4 including a plurality of vibrators 3 having leading ends, which are held in contact with the inner circumferential surface of the rotor 2 and at least one of which vibrates to rotate the rotor 2, wherein the rotor 2 is held by being pressed in contact with the respective leading ends of the plurality of vibrators 3 with the substantially cylindrical shape elastically deformed. More specifically, this ultrasonic motor 1 is a standing-wave motor comprised of the cylindrical rotor 2 and the stator 4 including the vibrator 3 having a right triangular shape with three apex portions as leading end parts, which are held in contact with the inner circumferential surface of the rotor 2.

This vibrator 3 includes a piezoelectric element 3a having such a shape obtained by cutting off the apexes of the right triangular shape, and tip members 3b secured to the cut apex parts of the piezoelectric element 3a, and a center of gravity position as a base end part to become a vibration node is fixed to a fixing member 5 by a fixing screw 6. Accordingly, this vibrator 3 is held in contact with the inner circumferential surface of the rotor 2 at a plurality of leading end parts, i.e. three leading end parts in the example shown in FIG. 1, wherefore noncontact parts of the rotor 2 can be more easily elastically deformed as compared with the case where the vibrator 3 is in contact with the rotor 2 over the entire circumference.

As shown in FIG. 1A, electrodes 7 are transversely symmetrically formed on one outer surface of the vibrator 3 with respect to lines connecting the above center of gravity to the respective apexes, and a common electrode is formed on the other outer surface. If a specified drive signal is inputted from an unillustrated drive signal generator to these electrodes via an FPC 8, high-frequency elliptical vibrations rotating in the same direction as shown by reference numeral 10 in a normal section to an axis of the rotor 2 are excited by displacements of the piezoelectric elements 3a at the respective apexes of the vibrator 3 (leading end parts of the tip members 3b).

On the other hand, the rotor 2 is made of an elastic metal material such as stainless steel. A hardening treatment such as a nitrogen treatment is applied to the outer surface of the rotor 2 to prevent abrasion. Alternatively, ceramic coating such as CrN or TiCN may be applied to the outer surface of the rotor 2. The shape of the rotor 2 is not limited to the above cylindrical shape, and may have any substantially cylindrical shape such as a bottomed cylindrical shape (cap shape). This rotor 2 rotates clockwise if the apexes of the vibrator 3 are in the same phase (standing waves) and undergo elliptical vibration in clockwise direction, whereas it rotates counterclockwise in the case of elliptical vibrations in counterclockwise direction. The rotational speed and torque of the rotor 2 change by changing the magnitude of the elliptical vibration. If at least one of the respective apexes of the vibrator 3 (leading end parts of the tip members 3b, a plurality of leading ends) undergoes elliptical vibration, the rotor 2 rotates by the sliding contact of at least one of the respective apexes of the vibrator 3.

Before the assembling with the vibrator 3, the diameter (inner diameter) of the rotor 2 is set smaller than a dimension of the vibrator 3. Thus, in an assembled state with the vibrator 3, the rotor 2 is deformed in such a direction as to extend the diameter (to have a rounded triangular shape) by the vibrator 3. As a result, a restoring force resulting from the elastic deformation of the rotor 2 acts as pressing (frictional) forces at three contact portions of the vibrator 3 and the rotor 2. The rotor 2 has radial movements relative to the vibrator 3 prevented without any backlash by these contacts at three positions.

In other words, the diameter of an imaginary right circle touching the respective apexes of the vibrator 3 (leading end parts of the tip members 3b, a plurality of leading ends) differs from that of the cylindrical shape of the rotor 2, and the cylindrical shape of the rotor 2 is retained by the pressing contact with the respective apexes of the vibrator 3 while being constantly elastically deformed.

Further, as shown in FIG. 1B, the rotor 2 is bent near the contact portions with the tip members 3b of the vibrator 3 in a section along the axial direction of the rotor 2, thereby forming a recessed groove 9 continuous in a circumferential direction. In the section of the rotor 2 in FIG. 1B, the V-shaped groove is formed when viewed from a radially inner side and the respective R-shaped contact portions (apex portions) of the vibrator 3 are fitted in this groove. Thus, movements of the rotor 2 in a rotational axis direction and in inclining directions with respect to the axial direction are also prevented. In this way, even without using a bearing such as a conventional ball bearing, the rotor 2 can be rotationally supported without any backlash in both radial and axial directions, wherefore it becomes possible to improve response.

By obviating the need for the bearing and limiting the contact parts of the rotor 2 and the vibrator 3 to the apex portions of the right triangular vibrator 3 instead of holding the rotor 2 and the vibrator 3 in contact over the entire circumference, the rotor 2 has the noncontact parts, which are not constrained by the vibrator 3, and the rotor 2 can be more easily elastically deformed as compared with the case of contact in the entire circumference. Thus, a spring constant when the rotor 2 is seen as a spring charged by the apex portions to generate pressing (frictional) forces is smaller as compared with the case of contact in the entire circumference. This enables the variation of the pressing force in relation to an error amount to be suppressed even if the vibrator 3 and the rotor 2 have dimensional manufacturing errors. Further, even if the dimensions of the vibrator 3 and the rotor 2 change in response to, for example, a temperature change, the variation of the pressing force can be suppressed since the spring constant is small, wherefore the pressing force is stabilized. In this way, error sensitivity to the magnitude of the pressing force can be reduced, with the result that a drive performance can also be stabilized.

Since the pressing force is generated from the elastic deformation of the rotor 2 itself, an external pressing mechanism becomes unnecessary, which can contribute to the simplification and miniaturization of the mechanism. Further, a step of adjusting the pressing force also becomes unnecessary, leading to an improvement in productivity.

Figure 2A:
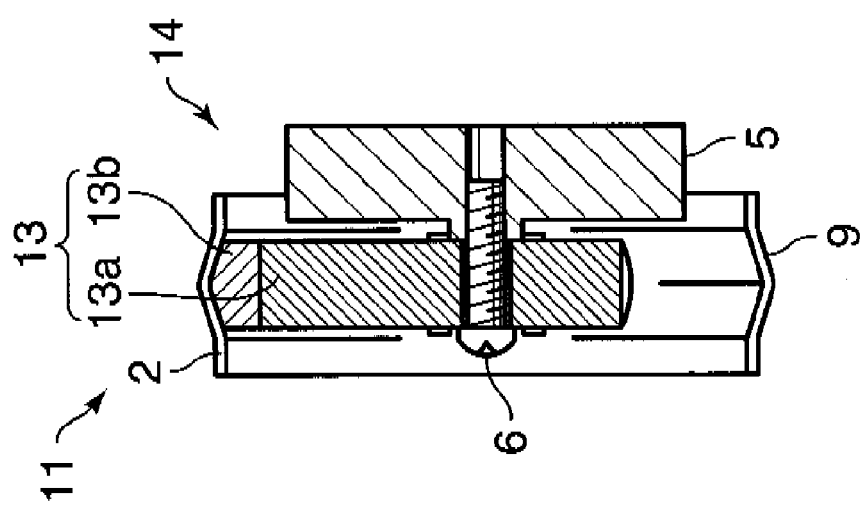
FIGS. 2A and 2B are a front view and a section showing the construction of another ultrasonic motor as the friction drive actuator according to the one embodiment of the invention.

The shape of the vibrator 3 is not limited to a triangular shape as shown in FIG. 1A and a rectangular shape may be, for example, employed as in a vibrator 13 shown in FIG. 2A.

Figure 2B:
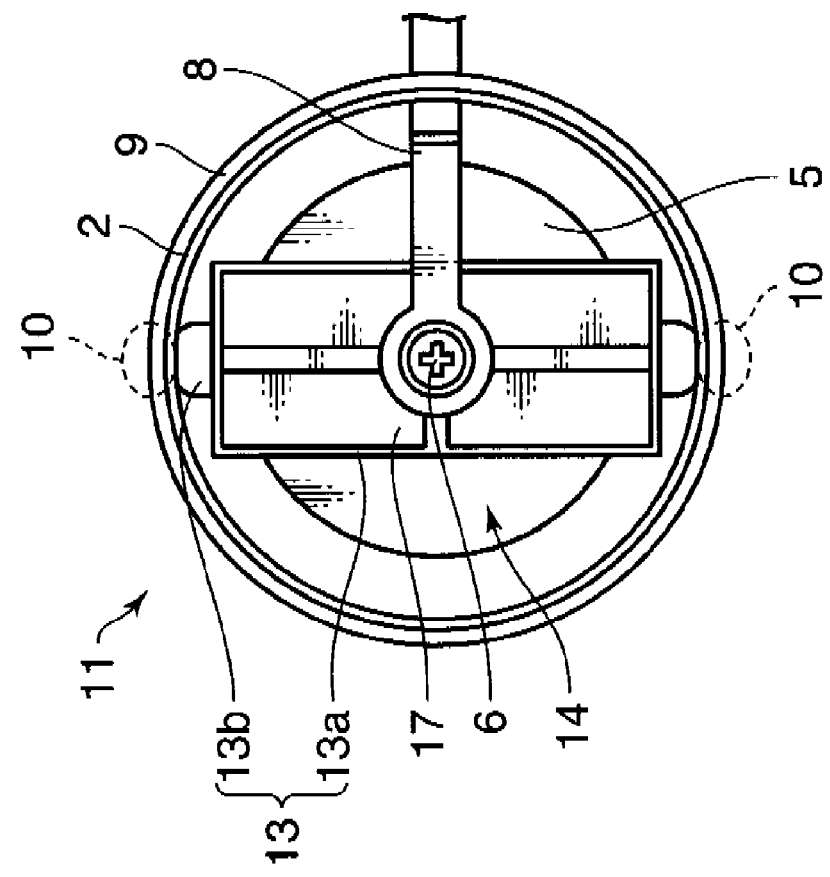

FIGS. 2A and 2B are a front view and a section showing the construction of another ultrasonic motor as the friction drive actuator according to the one embodiment of the present invention.

This ultrasonic motor 11 is similar to the above ultrasonic motor 1, and corresponding parts are not described by being identified by the same reference numerals.

The vibrator 13 includes a rectangular piezoelectric element 13a, and tip members 13b secured to middle parts of a pair of shorter sides of the piezoelectric element 13a, and a center of gravity position to become a vibration node is fixed to the above fixing member 5 by a fixing screw 6. As shown in FIG. 2A, electrodes 17 are transversely symmetrically formed on one outer surface of the vibrator 13 with respect to lines connecting the above center of gravity with the middle parts of the respective shorter sides, and a common electrode is formed on the other outer surface. If a specified drive signal is inputted from an unillustrated drive signal generator to these electrodes via the above FPC 8, high-frequency elliptical vibrations rotating in the same direction as shown by reference numeral 10 in a normal section to an axis of the rotor 2 are excited by displacements of the piezoelectric elements 13a at the two apexes of the vibrator 13 (leading end parts of the tip members 13b).

Figure 3:
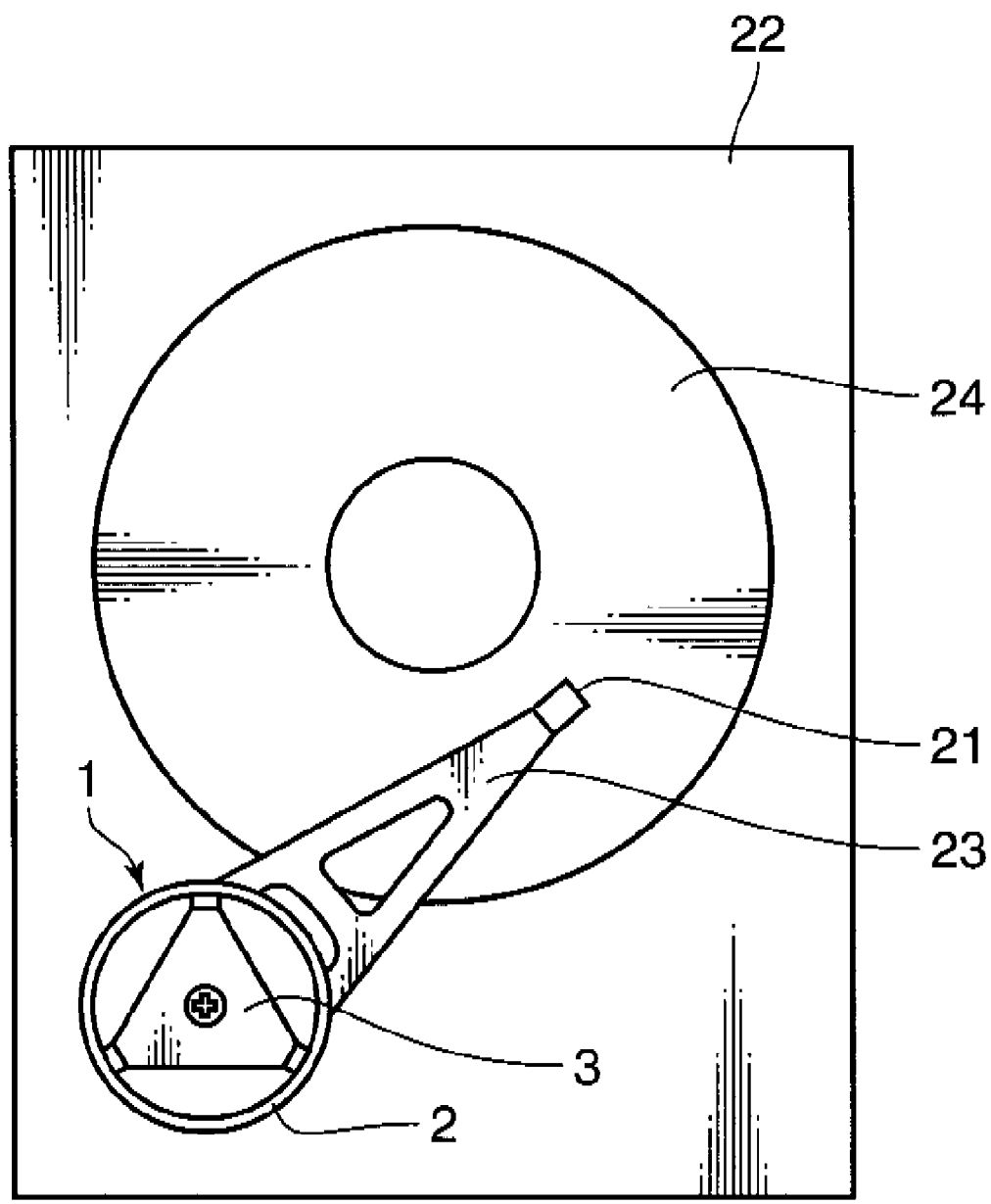
FIG. 3 is a schematic construction diagram of a HDD using the ultrasonic motor shown in FIG. 1 or 2 to drive a HDD magnetic recording head.

FIG. 3 is a schematic construction diagram of a HDD 22 employing the ultrasonic motor 1 shown in FIG. 1 or the ultrasonic motor 11 shown in FIG. 2 for driving a HDD magnetic recording head 21. In FIG. 3, the HDD 22 includes the ultrasonic motor 1 as an example of the friction drive actuator, a rotatable disk 24 on which data is to be recorded, a rotary shaft supporting portion, the magnetic recording head 21, and a head arm 23 operative to store and/or read data on or from the disk 24 by means of the magnetic recording head 21.

In the construction of the conventional drive actuator for a HDD magnetic recording head, the head arm 23 mounted with the magnetic recording head 21 is rotatably supported by a pivot bearing and driven by a VCM (voice coil motor). On the contrary, in this embodiment, the head arm 23 is rotatably supported and driven by the ultrasonic motor 1 or 11 (1 in the example of FIG. 3).

More specifically, the ultrasonic motor 1 is arranged at a side of the disk 24 to be driven and rotated. One end of the head arm 23 is secured with this ultrasonic motor 1 as a rotary shaft on the outer circumferential surface of the rotor 2 except the recessed groove 9 inscribing the vibrator 3 (on the cylindrical parts at the opposite sides of the recessed groove 9) or on an end portion of the cylindrical shape of the rotor 2. By driving and rotating the disk 24, the magnetic recording head 21 mounted at the other end of the head arm 23 circumferentially travels on the disk 24 being driven and rotated, whereby a recording content is written on, erased from and read from the disk 24. Then, the ultrasonic motor 1 is driven by unillustrated control means to move the magnetic recording head 21 in a radial direction of the disk 24, thereby realizing a search operation to write, erase or read the content on or from a desired recording position.

In the case of driving the head arm 23 of such a HDD device 22, a position control needs to be performed on the disk 24 rotating at a high speed while following, for example, the undulation of a track. Thus, an actuator is normally required to have very high response and resolution. Since none of bearing backlash, bearing inertia and bearing load is present and frictional forces between the stator 4, 14 and the rotor 2 become more stable by using the above ultrasonic motor 1, 11 to drive the magnetic recording head 21 as in this embodiment, it becomes possible to obtain a high response and improve a recording density.

Second Embodiment

Figure 4B:
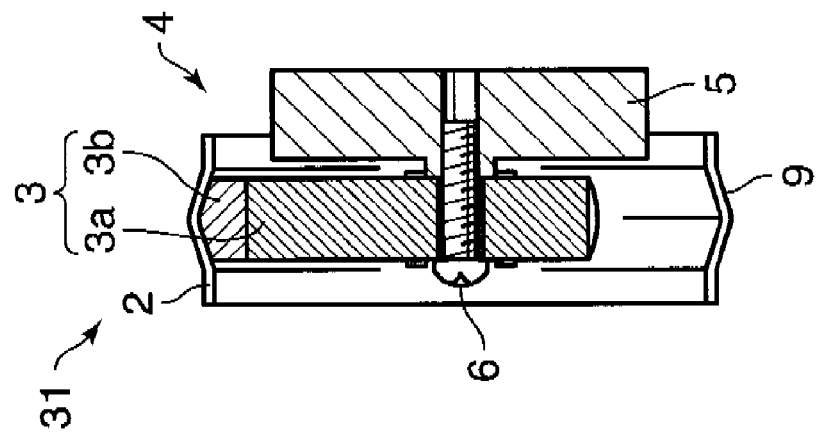
FIGS. 4A and 4B are a front view and a section showing the construction of an ultrasonic motor as a friction drive actuator according to another embodiment of the invention.
Figure 4A:
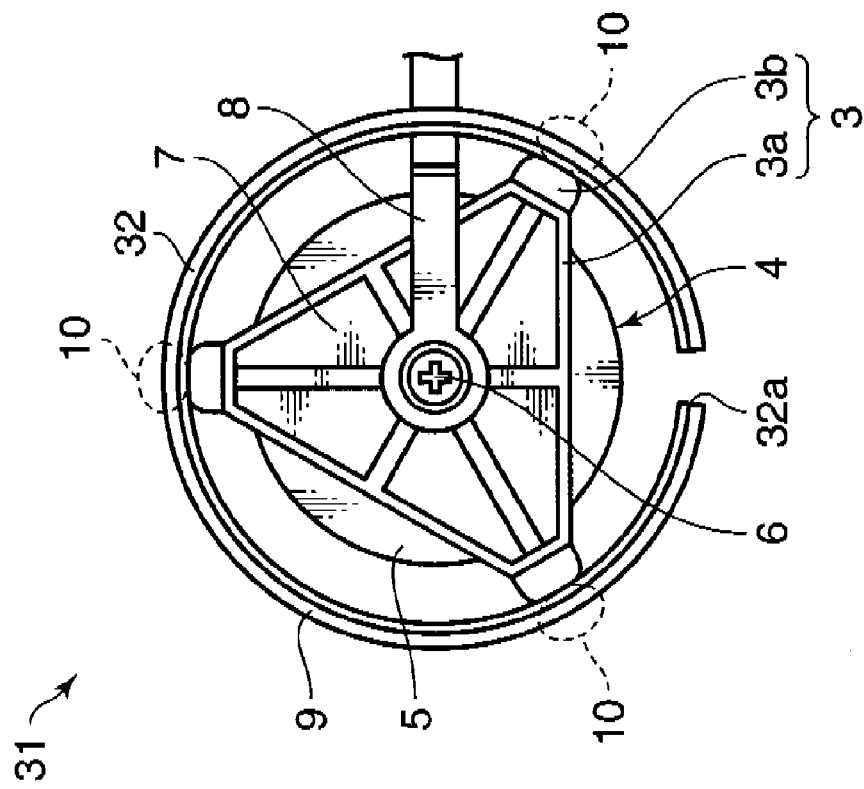

FIGS. 4A and 4B are a front view and a section showing the construction of an ultrasonic motor 31 as a friction drive actuator according to another embodiment of the present invention.

This ultrasonic motor 31 is similar to the above ultrasonic motor 1, and corresponding parts are not described by being identified by the same reference numerals.

In this ultrasonic motor 31, the construction of a stator 4 including a vibrator 3 is the same as in the above ultrasonic motor 1. What should be noted is that a cutout 32a linear in an axial direction is formed in a part of a rotor 32 on the circumference. Accordingly, as compared with the above rotor 2 continuous over the entire circumference, a spring constant of the rotor 32 can be made smaller by the cutout 32a. Thus, error sensitivity to the magnitude of a pressing force can be further reduced to further stabilize the pressing force.

Figure 5A:
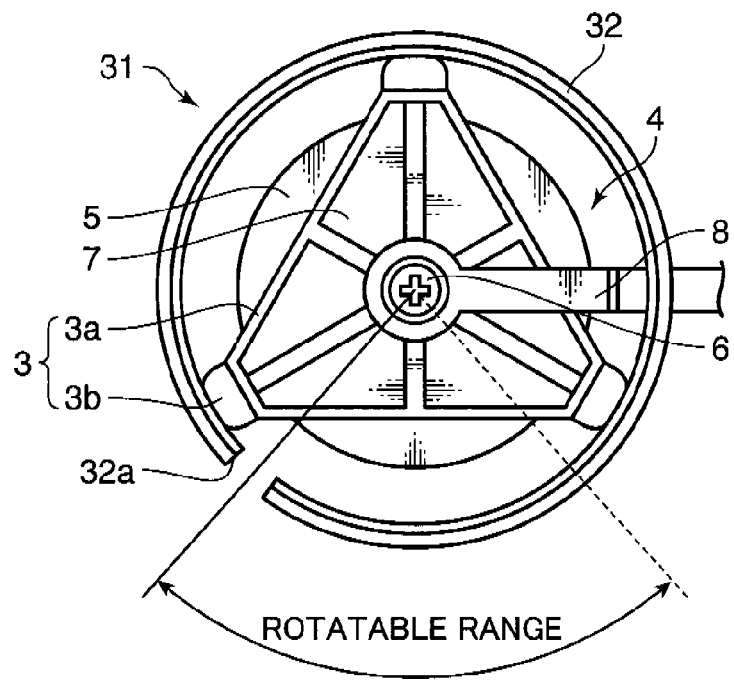
FIGS. 5A and 5B are diagrams showing a rotatable range of a rotor in the ultrasonic motor shown in FIG. 4, FIGS. 6A and 6B are a front view and a section showing the construction of an ultrasonic motor as a friction drive actuator according to still another embodiment of the invention.
Figure 5B:
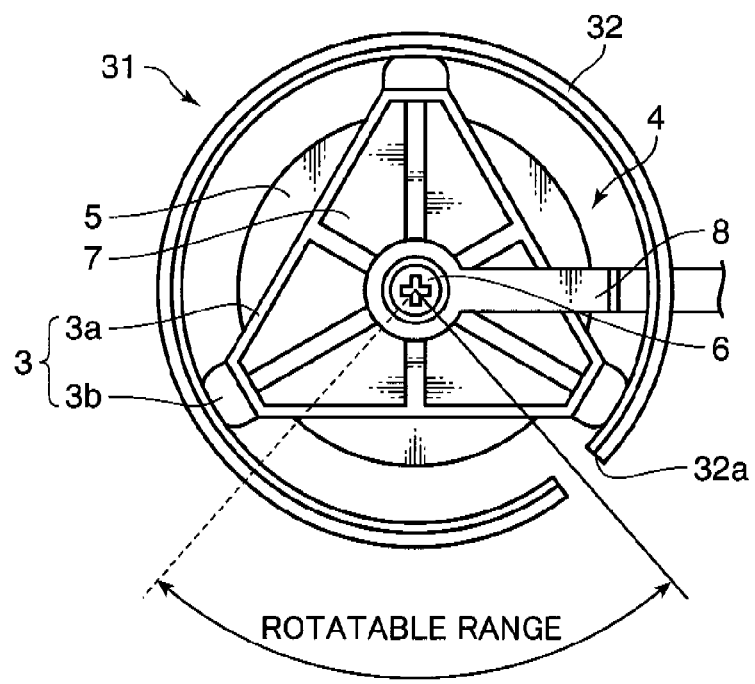
Figure 7:
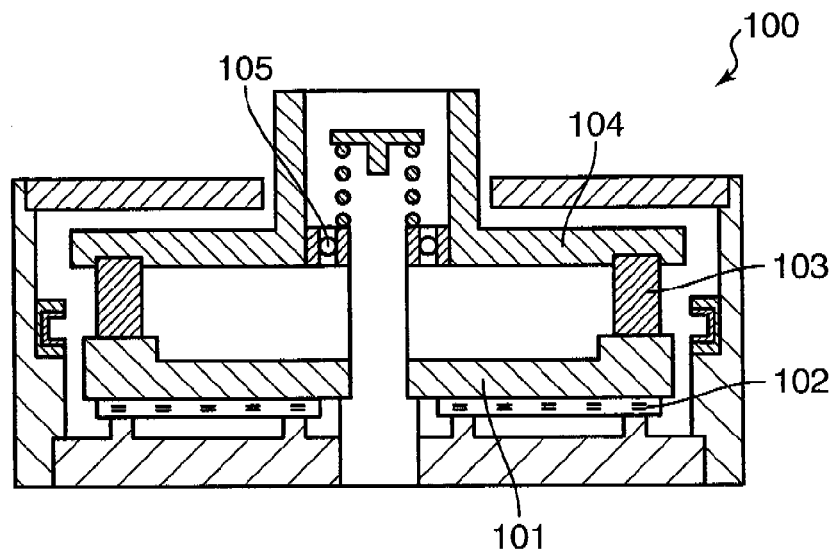
FIG. 7 is a section of an ultrasonic actuator according to a typical prior art for driving a magnetic recording head of a HDD.
Figure 8:
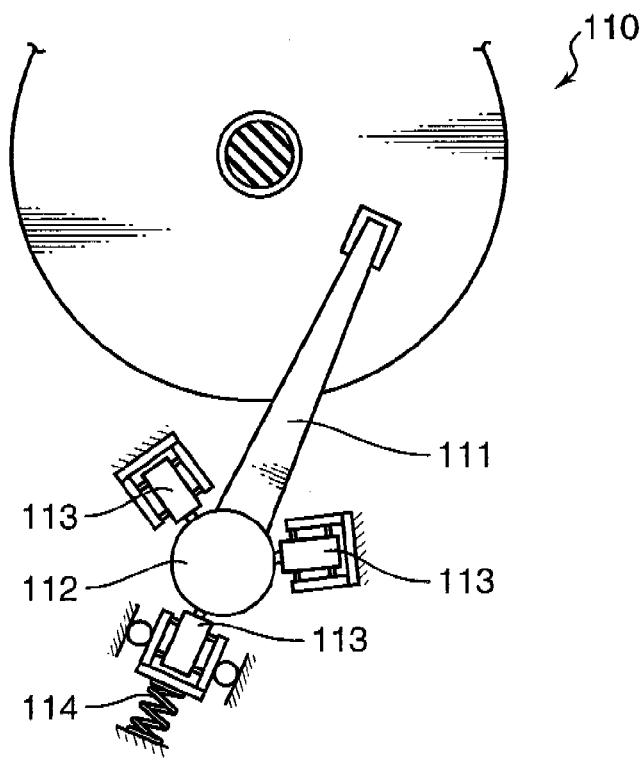
FIG. 8 is a plan view of another prior art.

Here, a rotatable range of the rotor 32 is restricted to an angle range where contact portions of the vibrator 3 (leading end parts of tip members 3b) do not reach the cutout 32a as shown in FIGS. 5A and 5B. Accordingly, if the rotatable range of the rotor 32 is smaller than the pivotal range of the head arm 23 in the HDD 22 as shown in FIG. 3, the shape of the vibrator 3 (piezoelectric element 3a) may be changed from the above equilateral triangular shape to an isosceles triangular shape with a large apex angle and two small base angles or the above rectangular vibrator 13 shown in FIG. 2 may be used.

Third Embodiment

FIGS. 6A and 6B are a front view and a section showing the construction of an ultrasonic motor 41 as a friction drive actuator according to still another embodiment of the present invention.

The ultrasonic motor 41 as an example of the friction drive actuator shown in FIG. 6 is roughly comprised of a substantially cylindrical rotor 42, and a frame 45 as a stator having a substantially cylindrical shape whose diameter is larger than that of the rotor 42, including at least three vibrators 43 having leading ends on its inscribing surface, wherein the respective leading ends of the vibrators 43 arranged at such positions of a substantially triangular shape in a normal section to an axis of the rotor 42 as to enclose the rotor 42 are held in contact with the outer circumferential surface of the rotor 42, and at least one of the plurality of leading end portions vibrates to rotate the rotor 42. The rotor 42 is held by being pressed in contact with the respective leading ends of these vibrators 43 with the substantially cylindrical shape elastically deformed.

More specifically, what should be noted in this ultrasonic motor 41 is that three separate vibrators 43 are present and arranged at such positions of the substantially triangular shape in the above normal section as to enclose the rotor 42. Each vibrator 43 is constructed such that a tip member 43B is mounted at a bent part of a dogleg-shaped piezoelectric element 43a in the above normal section and loose ends thereof are attached to the frame 45 at a fixed position via a bracket 46. The vibrator 43 undergoes elliptical vibration as shown by the reference numeral 10 by elongating and contracting motions and bending motions of the piezoelectric element 43a. If at least one of the apexes of the respective vibrators 43 (leading end parts of the tip members 43b, a plurality of leading ends) undergoes elliptical vibration, the rotor 43 rotates by the sliding contact of at least one of the respective apexes of the vibrators 43.

The rotor 42 inscribes the contact portions of the vibrators 43 (leading end parts of the tip members 43b) facing inward in the frame 45 in this way. Before the assembling with the vibrators 43, the diameter (outer diameter) of the rotor 42 is set larger than dimensions of the vibrators 43. Thus, in an assembled state with the vibrators 43, the rotor 42 is deformed by the vibrators 43 in such a direction as to reduce the diameter thereof. As a result, a restoring force resulting from the elastic deformation of the rotor 42 acts as pressing (frictional) forces at three contact portions of the vibrators 43 and the rotor 42. The rotor 42 has radial movements thereof relative to the vibrators 43 prevented without any backlash by these contacts at three positions.

In other words, the diameter of an imaginary right circle touching the apexes of the respective vibrators 43 (leading end parts of the tip members 43b, a plurality of leading ends) differs from the diameter of the cylindrical shape of the rotor 42, and the cylindrical shape of the rotor 42 is retained by the pressing contact with the apexes of the respective vibrators 43 while being constantly elastically deformed.

Further, as shown in FIG. 6B, the rotor 42 is also bent near the contact portions with the tip members 43b of the vibrators 43 in a normal section to an axis of the rotor 42, thereby forming a recessed groove 49 continuous in a circumferential direction. In the section of the rotor 42 in FIG. 6B, the V-shaped groove is formed when viewed from a radially outer side and the respective R-shaped contact portions (apex portions) of the vibrators 43 are fitted in this groove. Thus, movements of the rotor 42 in a rotational axis direction and in inclining directions with respect to the axial direction are also prevented. In this way, even without using a bearing such as a conventional ball bearing, the rotor 42 can also be rotationally supported without any backlash in both radial and axial directions, wherefore it becomes possible to improve response.

If the outer diameter of the rotor 2, 32 in the ultrasonic motor 1, 11, 31 is equal to the outer diameter of the frame 45 in the above ultrasonic motor 41, the ultrasonic motor 41 including the rotor 42 with a smaller diameter can increase the rotational speed. However, a torque decreases accordingly. Further, the FPC 8 can be more easily laid in the ultrasonic motor 41 since it needs not circumvent the rotor 2, 32. However, the head arm 23 can be more easily mounted on the rotors 2, 32, on which the head arm 23 is mountable from an outer side. Thus, depending on the situation around the disk 24 in the HDD 22, the construction for driving the rotor 2, 32 from the inner side by means of the vibrator 3, 13 and the construction for driving the rotor 42 from the outer side by means of the vibrators 43 may be used while being suitably selected.

Various modes of technologies are disclosed in this specification as described above. Out of these, main technologies are summarized as follows.

According to one mode, a friction drive actuator comprises a substantially cylindrical rotor; and a stator including a plurality of vibrators having leading ends, which are held in contact with the inner circumferential surface of the rotor and at least one of which vibrates to rotate the rotor, wherein the rotor is held by being pressed in contact with the respective leading ends of the plurality of vibrators with the substantially cylindrical shape elastically deformed.

According to another mode, a friction drive actuator comprises a substantially cylindrical rotor; and a stator having a substantially cylindrical shape whose diameter is larger than that of the rotor and including at least three vibrators having leading ends on an inscribing surface thereof, the respective leading ends of the at least three vibrators being held in contact with the outer circumferential surface of the rotor while being arranged at such positions of a substantially triangular shape in a normal section to an axis of the rotor as to enclose the rotor, and at least one of the plurality of leading ends vibrating at contact positions to rotate the rotor, wherein the rotor is held by being pressed in contact with the respective leading ends of the at least three vibrators with the substantially cylindrical shape elastically deformed.

According to still another mode, a friction drive actuator comprises a substantially cylindrical rotor; and a vibrator having a plurality of leading ends held in contact with the rotor, the rotor being rotated by the vibration of at least one of the plurality of leading ends, wherein the diameter of an imaginary right circle touching the plurality of leading ends differs from that of the cylindrical shape of the rotor; and the cylindrical shape of the rotor is retained by the pressing contact with the leading ends while being constantly elastically deformed.

According to these constructions, the friction drive actuator requires no bearing for the rotor. Contact parts of the rotor and the vibrator(s) are limited to the plurality of leading end parts. Thus, the rotor is formed with noncontact parts, which are not constrained by the vibrator(s), wherefore the rotor can be more easily elastically deformed as compared with the case where the rotor and the vibrator(s) are in contact over the entire circumference. Accordingly, a spring constant when the rotor is seen as a spring charged by the leading end parts to generate pressing (frictional) forces is smaller as compared with the case of contact in the entire circumference. Further, by setting the diameter of the rotor before being assembled and that of the imaginary right circle touching the leading end parts of the vibrator to differ from each other, the rotor is elastically deformed upon being assembled and pressing (frictional) forces acting at the contact parts of the rotor and the vibrator are generated by a restoring force from this elastic deformation.

Thus, even if the vibrator(s) and the rotor have dimensional manufacturing errors, the variation of the pressing force in relation to the error amount can be suppressed. Further, even if the dimensions of the vibrator(s) and the rotor change in response to, for example, a temperature change, the variation of the pressing force can be suppressed since the spring constant is small, wherefore the pressing force is stabilized. In other words, error sensitivity to the magnitude of the pressing force can be reduced, with the result that a drive performance can also be stabilized. Since the pressing force is generated from the elastic deformation of the rotor itself, an external pressing mechanism becomes unnecessary, which can contribute to the simplification and miniaturization of the mechanism. Further, a step of adjusting the pressing force also becomes unnecessary, leading to an improvement in productivity.

In this way, the contact parts of the rotor and the vibrator(s) are limited to the plurality of leading end parts instead of the entire circumference, whereby the noncontact parts, which are not constrained by the vibrator(s), are formed. Thus, the rotor can be more easily elastically deformed as compared with the case of contact in the entire circumference. Therefore, by holding the rotor not over the entire circumference with the stator, error sensitivity to the magnitude of the pressing force can be reduced and the drive performance can be stabilized.

According to still another mode, the rotor includes a recessed groove continuous in a circumference direction at contact portions with the leading end parts of the vibrator(s) and adapted to prevent movements of the rotor in an axial direction by letting the leading end parts fit thereinto. With this construction, the rotor can be positioned with respect to the axial direction by forming the recessed groove.

According to further another mode, the rotor includes a cutout in a part thereof on the circumference. With this construction, since the spring constant of the rotor can be made even smaller by the cutout, error sensitivity to the magnitude of the pressing force can be further reduced.

According to still another mode, it is preferable that the vibrator is accommodated in the rotor and has a substantially triangular shape in the normal section; and that three apex portions thereof serve as the leading end parts which undergo elliptical vibrations in the same direction and are held in sliding contact with the inner circumferential surface of the rotor. According to further another mode, it is preferable that the vibrator is accommodated in the rotor and has a substantially rectangular shape in the normal section; and that the opposite longitudinal ends thereof serve as the leading end parts which undergo elliptical vibrations in the same direction and are held in sliding contact with the inner circumferential surface of the rotor. According to still another mode, it is preferable that the vibrators are arranged at such positions of a substantially triangular shape in the normal section as to enclose the rotor; and that the apex portions thereof facing the rotor serve as the leading end parts which undergo elliptical vibrations in the same direction and are held in sliding contact with the outer circumferential surface of the rotor. With these constructions, a suitable construction can be employed depending on the use application of the friction drive actuator.

According to still another mode, a friction drive actuator comprises a substantially cylindrical rotor; and a stator including a vibrator held in contact with the inner or outer circumferential surface of the rotor, wherein the vibrator is fixed at its base end part, includes a plurality of leading end parts which undergo elliptical vibrations in a normal section to an axis of the rotor; the rotor is held by being pressed in contact with the plurality of leading ends of the vibrator with the substantially cylindrical shape elastically deformed; and the plurality of leading end parts come into sliding contact with the rotor to rotate the rotor.

According to the above construction, the friction drive actuator suitably used for driving a magnetic recording head of a HDD and so-called an ultrasonic actuator comprises the substantially cylindrical rotor having a cylindrical shape or a bottomed cylindrical shape (cap shape), and the stator including the vibrator including the leading end parts held in contact with the inner or outer circumferential surface of the rotor in radial directions at a plurality of positions. The base end part of the vibrator is fixed and the leading end parts thereof undergo elliptical vibrations by performing combinations of bending motions and elongating and contacting motions in the normal section of the rotor through piezoelectric displacements. Thus, the rotor, with which the leading end parts are held in sliding contact, is rotated. Therefore, the friction drive actuator requires no bearing for the rotor. The contact parts of the rotor and the vibrator are limited to the plurality of leading end parts instead of the entire circumference. Thus, noncontact parts, which are not constrained by the vibrator, are formed. Hence, the rotor can be more easily elastically deformed as compared with the case of contact in the entire circumference. Therefore, a spring constant when the rotor is seen as a spring charged by the leading end parts to generate pressing (frictional) forces is smaller as compared with the case of contact in the entire circumference. If the diameter of the rotor before being assembled and that of an imaginary right circle touching the leading end parts of the vibrator are set to be different (the diameter of the rotor is smaller in the case of fitting the rotor at an outer circumferential side of the vibrator while being larger in the case of fitting the rotor at an inner circumferential side of the vibrator), the rotor is elastically deformed upon being assembled and pressing (frictional) forces acting at the contact parts of the rotor and the vibrator are generated by a restoring force from this elastic deformation.

Thus, even if the vibrator and the rotor have dimensional manufacturing errors, the variation of the pressing force in relation to the error amount can be suppressed. Further, even if the dimensions of the vibrator and the rotor change in response to, for example, a temperature change, the variation of the pressing force can be suppressed since the spring constant is small, wherefore the pressing force is stabilized. In other words, error sensitivity to the magnitude of the pressing force can be reduced, with the result that the drive performance can also be stabilized. Since the pressing force is generated from the elastic deformation of the rotor itself, an external pressing mechanism becomes unnecessary, which can contribute to the simplification and miniaturization of the mechanism. Further, a step of adjusting the pressing force also becomes unnecessary, leading to an improvement in productivity.

According to further another mode, a hard disk device comprises any one of the above friction drive actuators; a rotatable disk, on which data is to be recorded; a rotary shaft supporting portion; a head; and a head arm operative to store and/or read data on or from the disk by means of the head, wherein the rotary shaft supporting portion includes the friction drive actuator.

According to this construction, there can be realized a hard disk device comprising an actuator requiring no bearing and capable of more stabilizing a frictional force between a stator and a rotor.

While the invention has been adequately and sufficiently described to be expressed by way of the embodiments with reference to the drawings above, it should be appreciated that a person skilled in the art can easily modify and/or improve the above embodiments. Accordingly, modifications and improvements made by the person skilled in the art are construed to be embraced by the scope of the invention unless they depart from the scope as claimed.

What is claimed is:

1. A friction drive actuator, comprising:
   a substantially cylindrical rotor; and
   a stator including a plurality of vibrators having leading ends, which are held in contact with the inner circumferential surface of the rotor and at least one of which vibrates to rotate the rotor,
   wherein the rotor is held by being pressed in contact with the respective leading ends of the plurality of vibrators with the substantially cylindrical shape elastically deformed.

2. A friction drive actuator according to claim 1, wherein the rotor includes a recessed groove continuous in a circumference direction at contact portions with the leading end parts of the vibrators and adapted to prevent movements of the rotor in an axial direction by letting the leading end parts fit thereinto.

3. A friction drive actuator according to claim 1, wherein the rotor includes a cutout in a part thereof on the circumference.

4. A friction drive actuator according to claim 1, wherein:
   the vibrator is accommodated in the rotor and has a substantially triangular shape in the normal section; and
   three apex portions thereof serve as the leading end parts which undergo elliptical vibrations in the same direction and are held in sliding contact with the inner circumferential surface of the rotor.

5. A friction drive actuator according to claim 1, wherein:
   the vibrator is accommodated in the rotor and has a substantially rectangular shape in the normal section; and
   the opposite longitudinal ends thereof serve as the leading end parts which undergo elliptical vibrations in the same direction and are held in sliding contact with the inner circumferential surface of the rotor.

6. A friction drive actuator, comprising:
   a substantially cylindrical rotor; and
   a stator having a substantially cylindrical shape whose diameter is larger than that of the rotor and including at least three vibrators having leading ends on an inscribing surface thereof, the respective leading ends of the at least three vibrators being held in contact with the outer circumferential surface of the rotor while being arranged at such positions of a substantially triangular shape in a normal section to an axis of the rotor as to enclose the rotor, and at least one of the plurality of leading ends vibrating at the contact positions to rotate the rotor,
   wherein the rotor is held by being pressed in contact with the respective leading ends of the at least three vibrators with the substantially cylindrical shape elastically deformed.

7. A hard disk device, comprising:
   a friction drive actuator according to claim 1;
   a rotatable disk, on which data is to be recorded;
   a rotary shaft supporting portion;
   a head; and
   a head arm operative to store and/or read data on or from the disk by means of the head,
   wherein the rotary shaft supporting portion includes the friction drive actuator.

8. A friction drive actuator, comprising
   a substantially cylindrical rotor; and
   a vibrator having a plurality of leading ends held in contact with the rotor, the rotor being rotated by the vibration of at least one of the plurality of leading ends,
   wherein the diameter of an imaginary right circle touching the plurality of leading ends differs from that of the cylindrical shape of the rotor; and
   the cylindrical shape of the rotor is retained by the pressing contact with the leading ends while being constantly elastically deformed.

* * * * *